(12) United States Patent
Huang et al.

(10) Patent No.: US 11,789,129 B2
(45) Date of Patent: Oct. 17, 2023

(54) RECTANGULAR PULSE DRIVING CIRCUIT USING CATHODE PRE-CHARGE AND CATHODE-PULL COMPENSATION

(71) Applicant: Lumentum Operations LLC, San Jose, CA (US)

(72) Inventors: Hao Huang, San Jose, CA (US); Mikhail Dolganov, Gilroy, CA (US); Lijun Zhu, Dublin, CA (US)

(73) Assignee: Lumentum Operations LLC, San Jose, CA (US)

( * ) Notice: Subject to any disclaimer, the term of this patent is extended or adjusted under 35 U.S.C. 154(b) by 579 days.

(21) Appl. No.: 16/948,680

(22) Filed: Sep. 29, 2020

(65) Prior Publication Data

US 2022/0011410 A1 Jan. 13, 2022

Related U.S. Application Data

(60) Provisional application No. 63/048,996, filed on Jul. 7, 2020.

(51) Int. Cl.
  *G01S 7/4861* (2020.01)
  *G02F 1/01* (2006.01)
  *H01S 5/042* (2006.01)
  *H03K 3/53* (2006.01)
  (Continued)

(52) U.S. Cl.
  CPC .......... *G01S 7/4861* (2013.01); *G01S 7/4865* (2013.01); *G01S 7/4868* (2013.01); *G02F 1/0121* (2013.01); *H01S 5/042* (2013.01); *H01S 5/0428* (2013.01); *H03K 3/53* (2013.01); *G02F 2203/26* (2013.01)

(58) Field of Classification Search
  CPC ...... H01S 5/042; H01S 5/0427; G01S 7/4861; G02F 1/0121
  USPC .............................................. 372/38.07, 38.02
  See application file for complete search history.

(56) References Cited

U.S. PATENT DOCUMENTS

| | | |
|---|---|---|
| 7,947,918 B2 | 5/2011 | Buhler et al. |
| 9,493,765 B2 | 11/2016 | Krishnaswamy et al. |
| 10,158,211 B2 | 12/2018 | Barnes et al. |

(Continued)

OTHER PUBLICATIONS

"High Power VCSELs for Gesture Recognition," 2012, Finisar Corporation, Sunnyvale, CA, 5 pages.

(Continued)

*Primary Examiner* — Tuan N Nguyen
(74) *Attorney, Agent, or Firm* — Harrity & Harrity, LLP

(57) ABSTRACT

In some implementations, an electrical drive circuit may generate a rectangular optical pulse using cathode pre-charge and cathode-pull compensation. The electrical drive circuit may include an anode and a cathode to connect an optical load, a switch, a first source connected between the anode and a ground, a rectifier connected between the cathode and the switch, a capacitor connected in parallel with the rectifier, a second source connected to the ground, and an inductor connected between the switch and the second source. In some implementations, when the switch is closed and the optical load is connected, a first current is provided to the optical load through the first source, the rectifier, and the switch, and a second current is provided to the optical load through the first source, the capacitor, and the switch, where a rise time of the first current complements a fall time of the second current.

20 Claims, 10 Drawing Sheets

(51) Int. Cl.
*G01S 7/4865* (2020.01)
*G01S 7/486* (2020.01)

(56) References Cited

U.S. PATENT DOCUMENTS

| | | |
|---|---|---|
| 2003/0016711 A1 | 1/2003 | Crawford |
| 2007/0273862 A1 | 11/2007 | Barr |
| 2010/0087699 A1 | 4/2010 | Peterchev |
| 2014/0204396 A1 | 7/2014 | Giger et al. |
| 2014/0211192 A1 | 7/2014 | Grootjans et al. |
| 2017/0019965 A1* | 1/2017 | Takacs ................. H05B 45/375 |
| 2017/0085057 A1* | 3/2017 | Barnes ................. H01S 5/0428 |
| 2018/0323576 A1* | 11/2018 | Crawford ............. H02M 1/088 |
| 2020/0119527 A1 | 4/2020 | Hegblom |

OTHER PUBLICATIONS

Petrov et al., Co-pending U.S. Appl. No. 16/827,327, entitled "Methods for Driving Optical Loads and Driver Circuits for Optical Loads," filed Mar. 23, 2020 (38 pages).

* cited by examiner

RECTANGULAR PULSE DRIVING CIRCUIT USING CATHODE PRE-CHARGE AND CATHODE-PULL COMPENSATION

CROSS-REFERENCE TO RELATED APPLICATION

This application claims priority to U.S. Provisional Patent Application No. 63/048,996, entitled "SQUARE PULSE DRIVING CIRCUIT USING CATHODE PRE-CHARGE AND CATHODE-PULL COMPENSATION," filed Jul. 7, 2020, the content of which is incorporated by reference herein in its entirety.

TECHNICAL FIELD

The present disclosure relates generally to electrical drive circuits for optical loads and to methods and electrical drive circuits for driving an optical load to emit rectangular-shaped optical pulses using cathode pre-charge and cathode-pull compensation.

BACKGROUND

Time-of-flight-based (TOF-based) measurement systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses. For example, TOF-based measurement systems may perform direct time-of-flight (d-TOF) measurements by emitting a narrow optical pulse into a field of view. For applications that use indirect time-of-flight (i-TOF) measurements, a rectangular-shaped pulse train may be emitted into a field of view. For example, a rectangular-shaped pulse train (also referred to as a square wave or a pulse wave, among other examples) is a non-sinusoidal periodic waveform in which an amplitude alternates at a steady frequency between fixed minimum and maximum values. In an ideal rectangular-shaped pulse train, transitions between the minimum and maximum values are instantaneous or near-instantaneous.

SUMMARY

In some implementations, an electrical drive circuit to drive an optical load includes an anode and a cathode for connecting the optical load; a switch for controlling the electrical drive circuit, the switch defining a ground at a first end of the switch; a first source connected between the anode and the ground; a rectifier connected between the cathode and a second end of the switch; a capacitor connected in parallel with the rectifier; a second source connected to the ground; and an inductor connected between the second end of the switch and the second source, wherein, when the switch is closed and the optical load is connected: a first current is provided to the optical load through the first source, the rectifier, and the switch, a second current is provided to the optical load through the first source, the capacitor, and the switch, and a rise time of the first current complements a fall time of the second current.

In some implementations, an integrated circuit includes an interface to connect an optical load, and an electrical drive circuit to drive the optical load. The electrical drive circuit includes: an anode and a cathode to connect the optical load; a first circuit path that includes a switch, a first voltage source coupled between the anode and a first end of the switch that defines a ground of the electrical drive circuit, and a rectifier coupled between the cathode and a second end of the switch; and a second circuit path that includes the switch, the first voltage source, and a capacitor coupled in parallel with the rectifier between the cathode and the second end of the switch.

In some implementations, a method for driving an optical load includes connecting an optical load to an anode and a cathode of an electrical drive circuit; closing a switch at a first time to start an optical pulse based on an input trigger signal, wherein, when the switch is closed and the optical load is connected: a main current is provided to the optical load through a first source connected between the anode and a ground associated with a first end of the switch, a rectifier connected between the cathode and a second end of the switch, and the switch, a compensation current is provided to the optical load through the first source, a capacitor connected in parallel with the rectifier, and the switch, and an auxiliary current is provided through a second source connected to the ground, an inductor connected between the second end of the switch and the second source, and the switch; opening the switch at a second time to end the optical pulse based on the input trigger signal; and combining the main current and the compensation current such that a rise time of the main current and a fall time of the compensation current are complementary in time and amplitude to form the optical pulse with a rectangular shape.

DETAILED DESCRIPTION

Figure 1A:
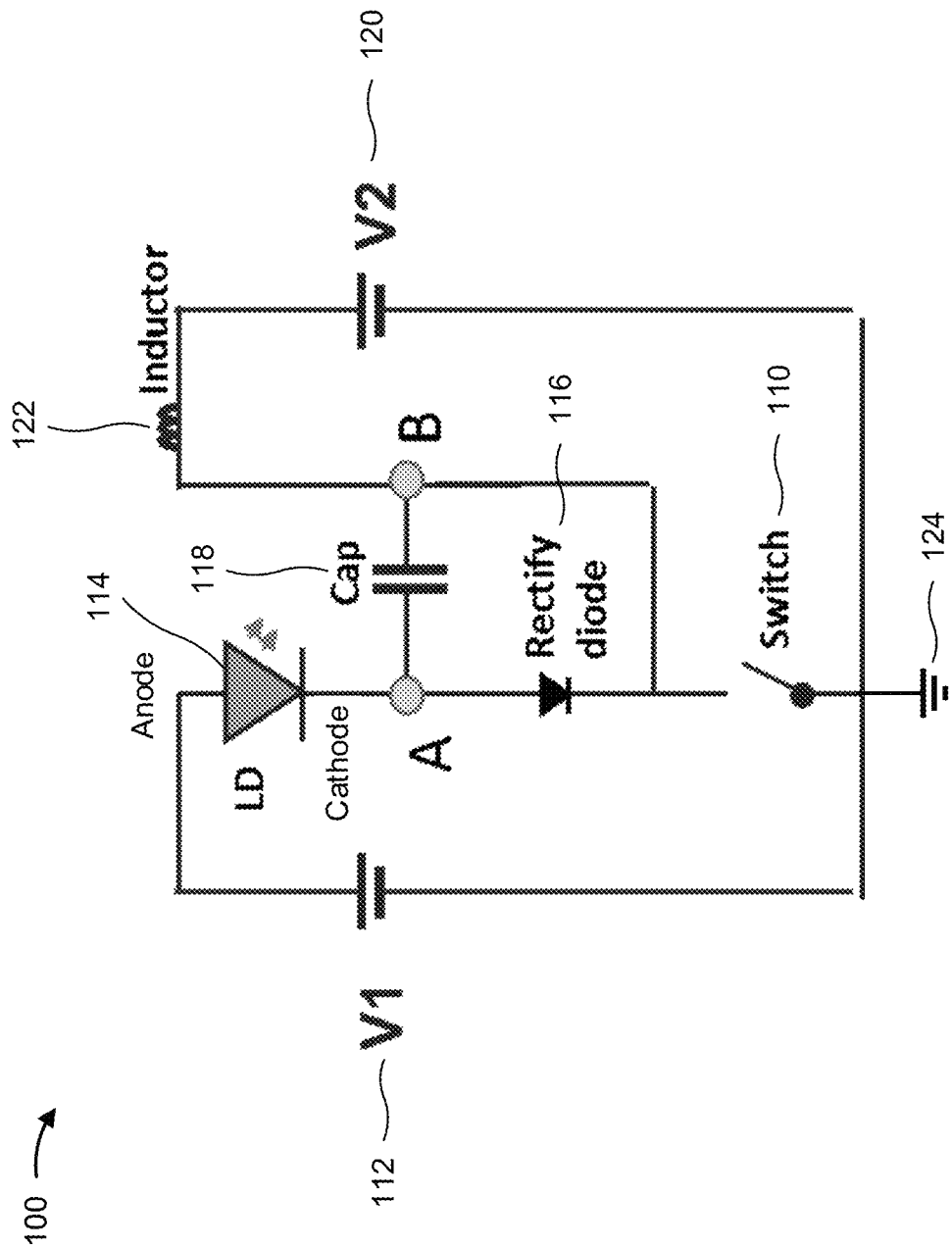
FIGS. 1A-1C are diagrams of an example electrical drive circuit described herein with a connected optical load.

The following detailed description of example implementations refers to the accompanying drawings. The same reference numbers in different drawings may identify the same or similar elements.

Time-of-flight-based (TOF-based) measurement systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses. TOF-based measurement systems may include an optical load (e.g., a laser diode, a semiconductor laser, a vertical-cavity surface-emitting laser (VCSEL), a VCSEL array, and/or the like) to emit optical pulses into a field of view. TOF-based measurement systems may be used to perform direct time-of-flight (d-TOF) measurements and/or indirect time-of-flight (i-TOF) measurements. For applications that use d-TOF measurements, a narrow optical pulse may be emitted into a field of view. For applications that use i-TOF applications, a rectangular-shaped pulse train may be emitted into a field of view. For example, as noted, a rectangular-shaped pulse train (also referred to as a square wave or a pulse wave, among other examples) is a non-sinusoidal periodic waveform in which an amplitude alternates at a steady frequency between fixed minimum and maximum values, ideally with instantaneous or near-instantaneous transitions between the minimum and maximum values.

In general, emitting an optical pulse that has a well-defined origin in time and a rectangular shape may improve measurement precision and accuracy (e.g., as compared to optical pulses having a non-rectangular shape, a long rise time, and/or the like). To achieve such a rectangular shape, an emitted optical pulse should generally have a short rise time (e.g., a time during which power of the optical pulse is rising) and a short fall time (e.g., a time during which power of the optical pulse is falling). For example, the rise time of an optical pulse may be a time during which power of the optical pulse rises from 10% of peak power to 90% of peak power, and may be referred to as a 10%-90% rise time. Similarly, the fall time of an optical pulse may be a time during which power of the optical pulse falls from 90% of peak power to 10% of peak power, and may be referred to as a 90%-10% fall time.

A circuit for driving an optical load typically includes a set of electronic components interconnected by current-carrying conductors (e.g., traces). Any of the electronic components and conductors may have parasitic elements (e.g., a parasitic inductance, a parasitic resistance, and/or a parasitic capacitance). These parasitic elements may be undesirable, and, therefore, sought to be minimized. However, completely eliminating these parasitic elements may not always be possible or practical (e.g., due to manufacturability limitations, component size limitations, and/or the like). When a supply voltage is provided to the circuit to drive the optical load, the parasitic inductance, parasitic resistance, and/or parasitic capacitance in the circuit causes a delay between a time when the supply voltage is provided and a time when a current reaches a peak. The delay increases the rise time of the electrical pulse, which increases the rise time of the optical pulse (e.g., particularly when driving the optical load with a high current).

Some implementations described herein provide a method and/or an electrical drive circuit for driving an optical load to emit a rectangular-shaped optical pulse and/or a pulse train of rectangular-shaped optical pulses using cathode pre-charge and cathode-pull compensation. For example, as described herein, the optical load may be driven to emit an optical pulse that has a short rise time (e.g., less than 100 picoseconds (ps)), a short fall time (e.g., less than 500 ps, less than 300 ps, and/or the like), and/or a constant amplitude. For example, some implementations described herein may use a cathode-pull method, cathode pre-charge compensation, and/or the like to provide a main current and a compensation current to the optical load. The main current combined with the compensation current form a rectangular-shaped pulse with a sharp rise time and a sharp fall time. In this way, some implementations described herein may drive an optical load to emit a rectangular-shaped optical pulse and/or an optical pulse train that includes a series of rectangular-shaped optical pulses, which improves performance of a TOF-based measurement system. Furthermore, some implementations described herein relate to an electrical drive circuit with only a single switch and a single input trigger signal, which simplifies circuit design, reduces costs, eliminates a need to align a timing of different trigger signals, increases power efficiency, and/or the like.

Figure 1B:
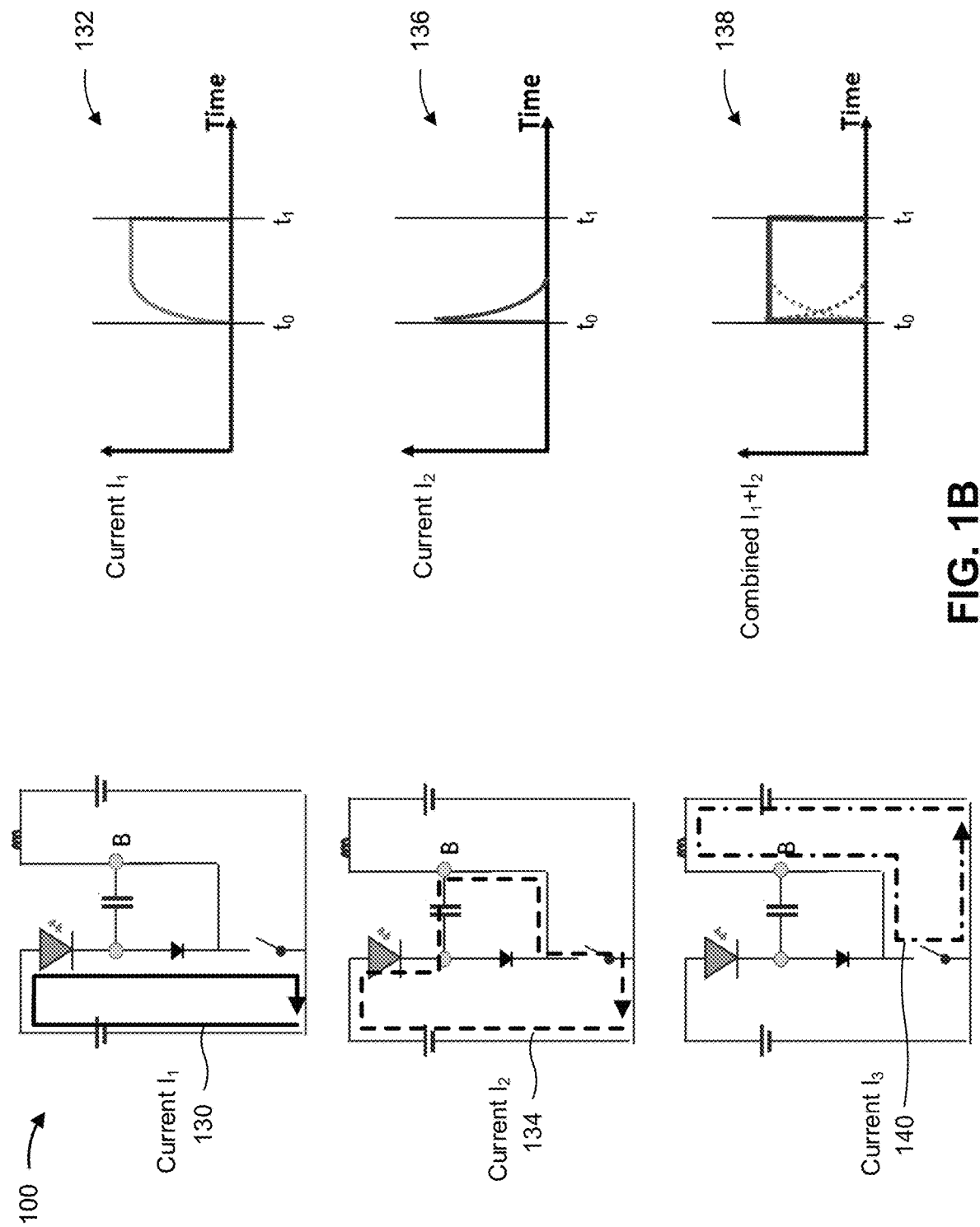
Figure 1C:
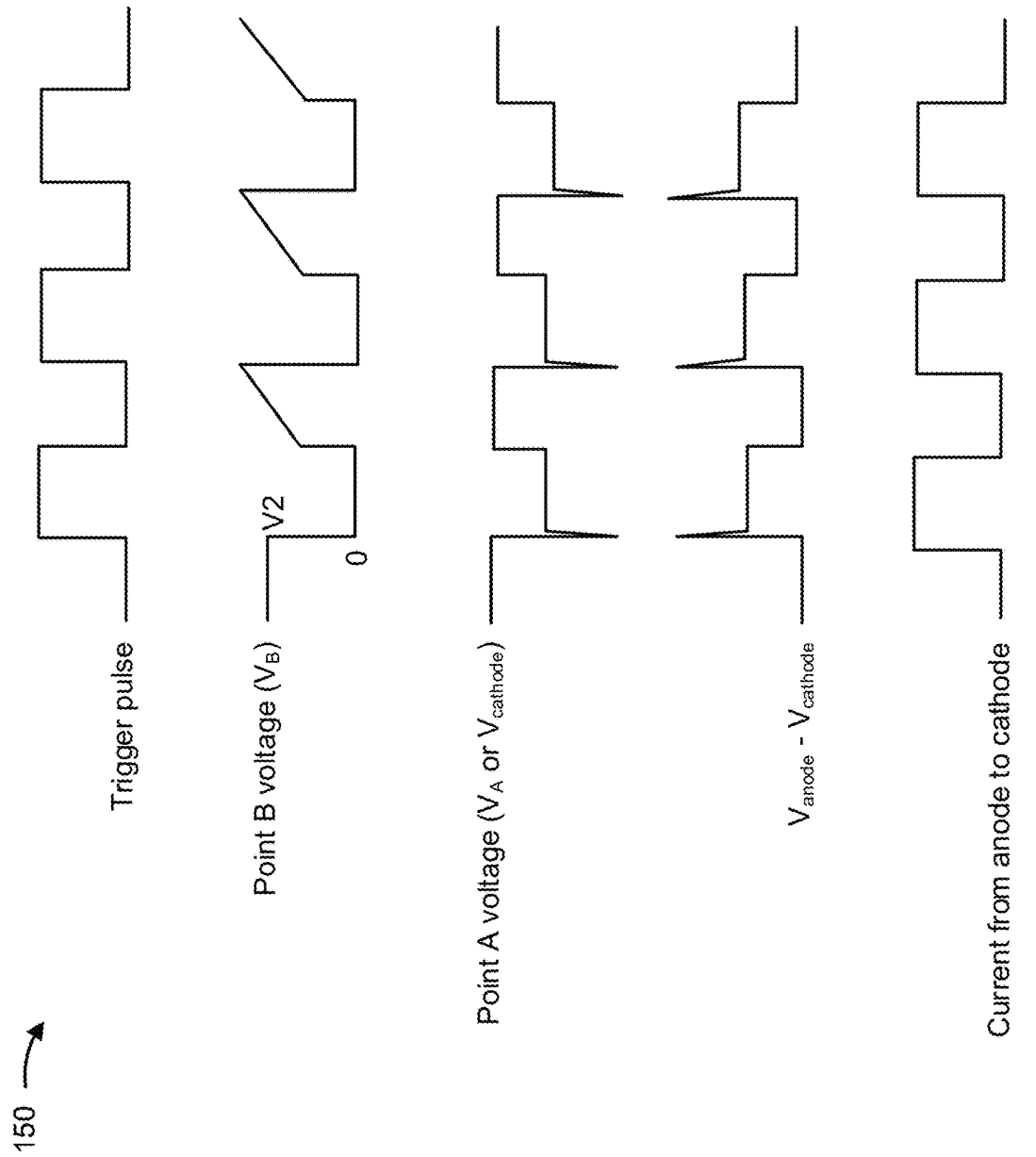

FIGS. 1A-1C are diagrams of an example electrical drive circuit 100 described herein. As shown in FIG. 1A, the electrical drive circuit 100 may include an interface to connect an optical load 114 (e.g., a laser diode, a vertical cavity surface emitting laser (VCSEL), an edge emitter, a multi-junction laser, a semiconductor laser, a distributed feedback laser, a Fabry Perot laser, or arrays of any of the preceding optical loads, among other examples). For example, in some implementations, the electrical drive circuit 100 may be provided in various forms, which may include discrete components (e.g., one or more capacitors, inductors, switches (including a field effect transistor (FET) gate and gate driver), and the optical load 114) that may be assembled together on a printed circuit board and/or substrate and/or integrated as a single integrated driver integrated circuit (e.g., semiconductor) chip. Alternatively, in some implementations, the electrical drive circuit may be partially integrated (e.g., the FET gate and gate driver may be integrated as a single component, the capacitor 118 and the optical load 114 may be integrated as a single component, and/or the like), or the optical load 114 and the electrical drive circuit 100 may be assembled on a single substrate and integrated as a single device. Accordingly, the interface may generally include one or more terminals, electrodes, traces, and/or other elements to connect the optical load 114 to other components of the electrical drive circuit 100 (e.g., the first source 112, the rectifier 116, and/or the capacitor 118), depending on the particular form of the electrical drive circuit 100. For example, in some implementations, the terminals, electrodes, traces, and/or the like may include an anode through which current enters into the optical load 114 and a cathode through which current leaves the optical load 114. In some implementations, the electrical drive circuit 100 may include or interface with one or more passive optical elements (not shown), such as a lens, a diffuser, a transparent cover, and/or the like.

As further shown in FIG. 1A, the electrical drive circuit 100, illustrated having an optical load 114 connected, may include a switch 110 that may control the electrical drive circuit 100, and the switch 110 may define a ground 124 at a first end of the switch 110. Furthermore, the electrical drive circuit 100 may include a first source 112 connected between the anode and the ground 124, and a rectifier 116 connected between the cathode and a second end of the switch 110. The rectifier 116 may include a rectifier diode, a sub-circuit, or other circuit elements to convert alternating current (AC) that periodically reverses direction to direct current (DC) that flows in only one direction. In some implementations, as described in further detail herein, the switch 110, the first source 112, and the rectifier 116 may define a first circuit path (e.g., a main current path), and a first current (e.g., a main current) may be generated in the first circuit path and provided to the optical load 114 through the first source 112, the rectifier 116, and the switch 110 when the switch 110 is closed and the optical load 114 is connected. In some implementations, the first source 112 may be a DC voltage source, a regulator, a DC-DC converter, an AC-DC converter, or any other suitable source that can supply a DC voltage.

In some implementations, the switch 110 may be a bipolar junction transistor (BJT) that is driven by current, a FET that is driven by voltage. The FET may be a Gallium Nitride (GaN) FET, a metal-oxide-silicon FET (MOSFET), a junction gate FET (JFET), and/or the like. In some cases, the switch 110 may be implemented as a FET because voltage driving is generally easier to implement relative to current driving at high speed. Furthermore, among the different FET options, a MOSFET is typically a silicon chip and therefore may be used in cases where the electrical drive circuit 110 is highly integrated at lower cost, whereas a GaN FET may be used in cases where higher performance (higher voltage tolerance, higher electron mobility and less resistance) is required. In some implementations, the switch 110 may include a gate driver that is used to turn the corresponding transistor on and off.

As further shown in FIG. 1A, the electrical drive circuit 100 may further include a capacitor 118 connected in parallel with the rectifier 116. In some implementations, as described in further detail herein, the switch 110, the first source 112, the capacitor 118, and the switch 110 may define a second circuit path (e.g., a compensation current path), and a second current (e.g., a compensation current) may be generated in the second circuit path and provided to the optical load 114 through the first source 112, the capacitor 118, and the switch 110 when the switch 110 is closed and the optical load 114 is connected to the electrical drive circuit 100. In some implementations, a rise time of the first current complements a fall time of the second current (e.g., in time and amplitude) such that the first current and the second current are both provided to the optical load 114 and combine at the optical load 114 to form an optical pulse having a rectangular wave shape with a rise time of the optical pulse defined by a rise time of the second current.

As further shown in FIG. 1A, the electrical drive circuit 100 may further include a second source 120 connected to the ground 124 and an inductor 122 connected between the switch 110 and the second source 120. In some implementations, the second source 120 may be a DC voltage source, a regulator, a DC-DC converter, an AC-DC converter, or any other suitable source that can supply a DC voltage. In some implementations, the second source 120, the inductor 122, and the switch 110 may define a third circuit path (e.g., an auxiliary current path), and closing the switch 110 may cause the inductor 122 to be pre-charged by the second source 120 and may cause a third current (e.g., an auxiliary current) to be generated in the third circuit path. As described in further detail herein, the inductor 122 may have a large inductance value to hold a quick current change from the second source 120 (e.g., to discharge or otherwise drain energy at a slow rate, such that the inductor 122 holds the current charge against being rapidly depleted after the switch 110 is closed). In this way, the third current may cause the second (compensation) current to be generated in the second current path by creating a negative voltage on the cathode side (e.g., cathode-pull compensation, as distinct from anode-push compensation that creates a positive voltage on the anode side).

In some implementations, the switch 110 for controlling the electrical drive circuit 100 may have an open state (e.g., an off state), where point B in the electrical drive circuit 100 is disconnected from the ground 124 when the switch 110 is in the open state. In this case, the inductor 122, which is pre-charged by the second source 120 when the switch 110 is closed, releases stored energy to boost a voltage at point B in the electrical drive circuit 100 to a higher voltage than the voltage supplied by the second source 120. Accordingly, when the switch 110 is closed, point B in the electrical drive circuit 100 is shorted to the ground 124 by the switch 110, which causes the voltage at point B to suddenly drop to zero. In this way, because the capacitor 118 is AC-coupled between point A and point B, the voltage at point A (e.g., the cathode of the optical load 114) drops by a similar amount as the voltage at point B. Accordingly, at the moment that the switch 110 is closed, the voltage at the anode of the optical load 114 is maintained at the same voltage as supplied by the first source 112, but the cathode (point A) has a voltage drop. In this way, a cathode-pull method creates a negative voltage on the cathode side, which causes the second current to be generated through the capacitor 118.

For example, as shown in FIG. 1B, the switch 110 may be closed at a time to, which may cause three current loops to be generated in the electrical drive circuit 100. For example, as shown by reference number 130, closing the switch 110 causes a first (e.g., main) current loop, current $I_1$, to be provided to the optical load 114 through the first source 112, the rectifier 116, and the switch 110. As shown by reference number 132, the first current loop may have a relatively long rise time (e.g., due to a parasitic inductance of the optical load 114, traces connecting the optical load 114 to the electrical drive circuit 100 or elements of the electrical drive circuit 100, and/or the like). Accordingly, as further shown by reference number 134, closing the switch 110 causes a second (e.g., compensation) current loop, current $I_2$, to be provided to the optical load 114 through the first source 112, the capacitor 118, and the switch 110. As shown by reference number 136, the second current loop may have an amplitude that complements an amplitude of the first current loop and a fall time that complements the rise time of the first current loop. For example, the first current loop and the second current loop have the same peak amplitude, and the fall time of the second current loop (e.g., a time for the second current to fall from 90% or more of the peak amplitude to 10% or less of the peak amplitude) is equal or approximately equal to the rise time of the first current loop (e.g., a time for the first current to reach the 90% or more of the peak amplitude). Accordingly, as shown by reference number 138, the first current provided to the optical load 114 and the second current that are provided to the optical load 114 while the switch 110 is closed combine to form a pulse having a rectangular wave shape, with a rise time of the pulse defined by the rise time of the second current. In some implementations, the pulse may end when the switch 110 is closed.

In some implementations, as further shown by reference number 140, the electrical drive circuit 100 includes the second source 120 and the inductor 122 to cause a third (e.g., auxiliary) current loop, current $I_3$, to flow through the second source 120, the inductor 122, and the switch 110 when the switch 110 is closed. In some implementations, the inductor 122 provided in the third current loop may have a large inductance value (e.g., tens of nano-henrys (nH)) to ensure that the large inductor holds a current charge from the second source 120. In this way, the inductor 122 ensures that the current from the second source 120 is discharged at a slow rate, whereby the current in the third current loop is a small current (e.g., a few tens of milliamps (mA)) that causes the second (compensation) current loop 12 to be generated while having a negligible impact on the pulse emitted by the optical load 114.

For example, the inductor 122 is pre-charged (e.g. increasing stored energy) by the second source 120 while the switch 110 is closed. Accordingly, when the switch 110 is open and point B in the electrical drive circuit 100 is disconnected from the ground 124 (e.g., at a time prior to to), the inductor 122 releases stored energy to boost a voltage at point B in the electrical drive circuit 100 to a higher voltage than supplied by the second source 120. In some implementations, this may be referred to as cathode pre-charge.

When the switch 110 is closed at time to, point B is shorted to the ground 124, which causes the voltage at point B to suddenly drop to zero, and the voltage at point A drops the same or a similar amount due to the capacitor 118 that provides an AC-coupling between point A and point B. In this way, in the moment when the switch 110 is closed or just after the switch 110 is closed, the voltage at the anode is maintained at the level supplied by the first source 112 and a voltage drop occurs at the cathode (point A). In this way, rather than flowing through the optical load 114, the third current loop causes a negative voltage to be created at the cathode such that the second (compensation) current is pulled to point B through the capacitor 118. In some implementations, this may be referred to as cathode-pull.

In this way, as shown in FIG. 1B, the main current loop (current $I_1$) and the compensation current loop (current $I_2$) may be provided to the optical load 114 when the switch 110 is closed, and the main current loop and the compensation current loop may combine at the optical load 114 to form a rectangular-shaped pulse with a sharp rise time and a sharp fall time. When the switch 110 is opened (e.g. after time ti), the pulse may end and the inductor 122 (that was pre-charged by the second source 120 while the switch 110 was open) may again discharge stored energy to boost the voltage at point B. In this way, when the switch 110 is closed again, the main current loop (current $I_1$) and the compensation current loop (current $I_2$) may again be provided to the optical load 114, which causes the optical load 114 to emit another rectangular-shaped pulse with a sharp rise time and a sharp fall time. This may be repeated multiple times to cause the optical load 114 to emit a pulse train of rectangular-shaped optical pulses using the cathode pre-charge and cathode-pull compensation techniques described herein. Furthermore, although a voltage oscillation may occur at point B when the inductor 122 releases stored energy (e.g., while the switch 110 is open), the voltage oscillation is generally very slow and does not affect the performance or operation of the optical load 114.

In some implementations, as shown in FIGS. 1A-1B, the electrical drive circuit 100 may generate the rectangular-shaped pulse (or pulse train of rectangular-shaped optical pulses) using a single switch 110, which simplifies the design of the electrical drive circuit 100 and reduces a cost of the electrical drive circuit 100, among other things. Furthermore, only a single input trigger signal is used to generate the three current loops that enable the rectangular-shaped pulse(s) to be generated, which eliminates a need to align the timing of different trigger signals (e.g., different trigger signals to generate the main current and/or the compensation current provided to the optical load 114, the current used to pre-charge the inductor 122, and/or the like).

For example, FIG. 1C illustrates detailed waveforms representing voltage and/or current changes at different points in the electrical drive circuit 100 as a function of a single trigger pulse used to control the switch 110. As shown, the trigger pulse may periodically transition between an off state and an on state, which may cause the switch 110 to toggle between an open state and a closed state. For example, in the example illustrated in FIG. 1C, the switch 110 may be open when the trigger pulse is low and the switch 110 may be closed when the trigger pulse is high. Alternatively, control logic may be defined such that the switch 110 is closed when the trigger pulse is low and open when the trigger pulse is high (in which case the other waveforms shown in FIG. 1C may be shifted accordingly). In some implementations, other waveforms of trigger pulse may be used to control switch 110.

As shown in FIG. 1C, when the trigger pulse is in a first (e.g., low) state, the switch 110 may be open and energy stored in the inductor 122 may be released to boost a voltage at point B ($V_B$) to a higher voltage than supplied by the second source 120. When the switch 110 is closed upon the trigger pulse transitioning to a second (e.g., high) state, $V_B$ suddenly drops to zero, and the voltage at point A ($V_A$ or $V_{cathode}$) drops by the same or a similar amount as $V_B$ due to the capacitor 118 that AC-couples point A and point B. In this way, because the voltage at the anode ($V_{anode}$) is maintained at the level supplied by the first source 112 and a voltage drop occurs at the cathode (point A), a voltage across the optical load ($V_{anode}-V_{cathode}$) includes a spike in an earlier portion of the duration when the trigger pulse is in the second state (while the switch 110 is closed) due to the compensation current loop (current $I_2$) that is provided to the optical load 114. Accordingly, as shown, a current from the anode to the cathode includes a series of rectangular-shaped pulses that have a sharp rise time and a sharp fall time, which is generated using a single trigger pulse signal to control the single switch 110. Furthermore, as described above, the inductor 122 is charged when the switch 110 is closed and discharges stored energy to boost $V_B$ when the switch 110 is open, whereby the single switch 110 is used to control both a pre-charging cycle for the inductor 122 and the generation of the main current and the compensation current that combine at the optical load 114 to form the rectangular-shaped pulse(s).

In some implementations, because the electrical drive circuit 100 has a single switch 110, the electrical drive circuit 100 has a higher power efficiency than the electrical drive circuit 100 would otherwise have if a second switch were to be used to pre-charge on the anode side (e.g., as in a typical anode-push method). For example, if a second switch were to be used to pre-charge on the anode side, the pre-charge current would not contribute to the current(s) provided to drive the optical load 114, which reduces the total power efficiency. Accordingly, because the electrical drive circuit 100 uses a single switch 110 to generate a small current (e.g., 10 mA) that pre-charges the inductor 122 and causes the second (compensation) current to be generated through a cathode-pull method, total power efficiency is significantly improved.

Furthermore, the electrical drive circuit may introduce minimal ripple on top of the rectangular-shaped pulse. For example, "ripple" generally refers to a residual periodic variation of DC voltage due to incomplete suppression of an alternating waveform. Ripple is typically wasted power, which has undesirable effects in a DC circuit (e.g., heating components, causing noise and distortion, and/or the like). Accordingly, the inductor 122 has a large inductance value that is selected to reduce an oscillation frequency of the rectangular-shaped pulse relative to a modulation frequency of the rectangular-shaped pulse, which may reduce the ripple on top of the rectangular-shaped pulse. Furthermore, the inductance value of the inductor 122 may be selected to hold the current from the second source 120 to cause the second (compensation) current loop 12 to be generated. For example, the inductance value needs to be large enough to provide sufficient (e.g. complementary to the main current) compensation current in the second current loop and avoid drawing current from the second source 120 that may otherwise cause the inductor 122 to become saturated. Otherwise, if the inductance value of the inductor 122 is too low, the switch 110 may pull high current from the second source 120, and the auxiliary current in the third current loop 13 will be too high. In such a case, the compensation current in the second current loop 12 will decrease, and provide insufficient compensation for the long rise time of the main current. Furthermore, the inductance value of the inductor 122 may be selected such that the inductor 122 is quickly pre-charged by the second source 120 when the switch 110 is closed, such that the auxiliary current is generated to cause the compensation current to be generated within a first few pulses.

In some implementations, the second source 120 may supply a voltage that is equal to or greater than a voltage supplied by the first source 112 (e.g., in order to create the negative voltage on the cathode that causes the compensation current to be generated using the cathode-pull techniques described herein). Additionally, or alternatively, the voltage supplied by the second source 120 may be greater than or equal to a difference between the voltage supplied by the first source 112 and a delta that is based on a combined voltage drop on the optical load 114 and the rectifier 116. For example, in the electrical drive circuit 100, there may be a first voltage drop on the optical load 114 (e.g., approximately 2V for a single-junction VCSEL, or a few times more than 2V for a multi-junction VCSEL) and a second voltage drop on the rectifier 116 (e.g., approximately 0.5V for a rectifier diode). The delta may be based on (e.g., may be a sum of) the first voltage drop and the second voltage drop. In some implementations, the cathode-pull techniques described herein may perform correctly in cases where the voltage supplied by the second source 120 ($V_2$) is greater than or equal to a difference between the voltage supplied by the first source 112 ($V_1$) and the delta ($\Delta V$) that is based on the combined voltage drop on the optical load 114 and the rectifier 116 (e.g., in cases where $V_2 \geq V_1 - \Delta V$, even if $V_2 < V_1$). Otherwise, if $V_2$ were to be less than the difference between $V_1$ and $\Delta V$ (e.g., $V_2 < V_1 - \Delta V$), a direct current would be generated on the optical load 114 independent of the switch 110, which is typically not desired.

In some implementations, as described above, the rise time of the first (main) current and the fall time of the second (compensation) current are complementary in time and amplitude such that the first current and the second current are simultaneously provided to the optical load 114 and combine at the optical load 114 to form a pulse having a rectangular wave shape with a rise time defined by a rise time of the second current. Accordingly, in some implementations, a capacitance value (e.g., a number of farads) of the capacitor 118, the inductance value of the inductor 122, and the voltage supplied by the second source 120 may be selected for the optical load 114 such that the rise time of the first current and the fall time of the second current are complementary in time and amplitude. For example, as described above, the first current and the second current may need to have the same peak amplitude in order to form a pulse with a rectangular shape. The first current may have an amplitude that is dependent on the voltage supplied by the first source 112, and the second current may have an amplitude that is associated with the voltage at point B ($V_B$) at the time that the switch 110 is closed (or just prior to the time that the switch 110 is closed). For example, the amplitude of the second current may be based on (e.g., proportional to) a difference between $V_B$ and a voltage at the end of the switch 110 that defines the ground 124 at the time or just prior to the time when the switch 110 is closed, where the value $V_B$ is determined by the voltage supplied by the second source 120, the inductance value of the inductor 122, and the charging time which is controlled by the width and duty cycle of the trigger pulse. Furthermore, in some implementations, the pulse width of the second current (e.g., the fall time of the second current) may be determined by the capacitance value of the capacitor 118, which may therefore be selected such that the pulse width of the second current is complementary (e.g., equal or approximately equal) to the rise time of the first current.

Accordingly, in some implementations, the values of the sources 112, 120, the capacitor 118, and/or the inductor 122 may be tuned to adjust the pulse shape (e.g., the difference between the voltages supplied by sources 112 and 120 may be tuned to adjust the amplitude of the second current that provides the compensation pulse, the capacitance of the capacitor 118 may be tuned to adjust the width of the compensation pulse, the inductance of the inductor 122 may be tuned to adjust the amplitude of the compensation pulse and/or to reduce the ripple on top of the rectangular-shaped pulse, and/or the like). For example, the electrical drive circuit 100 may have a resonance frequency that is determined by the following expression:

$$f = \frac{1}{2\pi\sqrt{LC}}$$

where L is the inductance value of the inductor 122 and the C is the capacitance value of the capacitor 118. The general relationship between L and C is that the value of LC (the product of L and C) is selected to ensure that the resonance frequency matches the modulation frequency to generate the compensation current 134 efficiently. Additionally, or alternatively, if the modulation frequency differs from the resonance frequency, the correct compensation current 134 may be generated by increasing the voltage supplied by the second source 120. For an iTOF modulation frequency, the inductor 122 may have an inductance value between 10 and 100 nH, the capacitor 118 may have a capacitance between 10 and 1000 pF, and the second source 120 may supply a voltage between 5 and 20 volts. In one example, the inductor 122 may have an inductance value around 50 nH, the capacitor 118 may have a capacitance value around 100 pF, and the second source 120 may supply a voltage around 10 volts.

As indicated above, FIGS. 1A-1C are provided as an example. Other examples may differ from what is described with regard to FIGS. 1A-1C.

FIGS. 2-6 are diagrams of example plots related to the performance and/or operation of an electrical drive circuit described herein (e.g., an electrical drive circuit that uses a cathode-pull method, cathode pre-charge compensation, and/or the like to simultaneously provide a main current and a compensation current to an optical load such that the main current and the compensation current combine to form a rectangular-shaped pulse). The plots shown in FIGS. 2-6 illustrate the performance and/or operation of the electrical drive circuit with a connected optical load.

Figure 2:
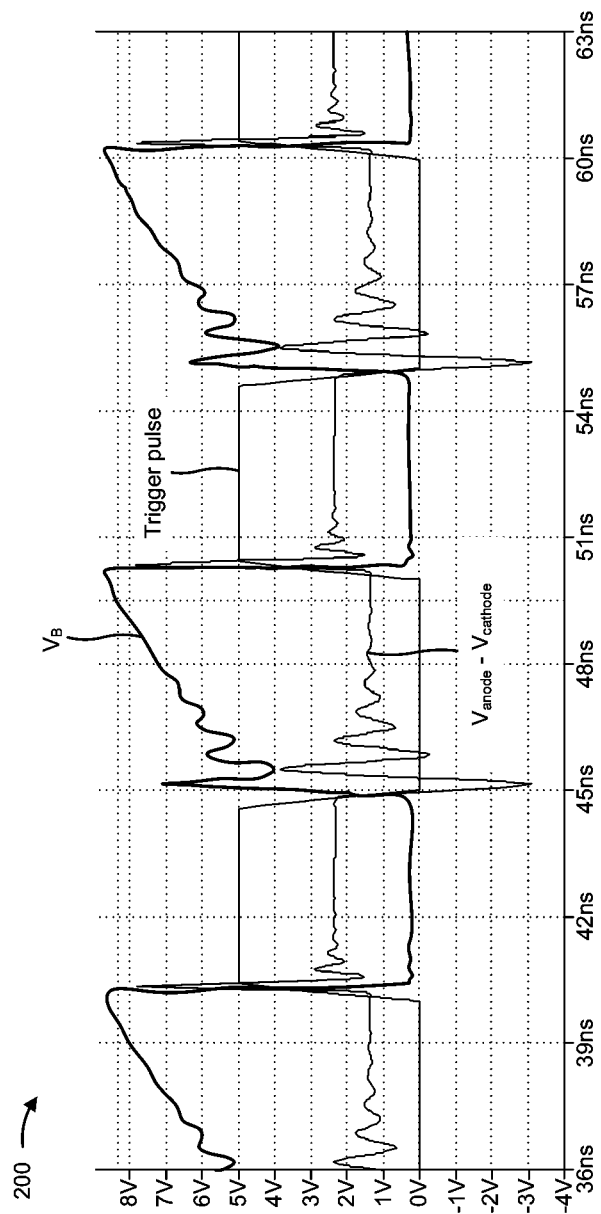
FIGS. 2-6 are diagrams of example plots related to the performance and/or operation of an electrical drive circuit described herein with a connected optical load.

For example, with reference to the electrical drive circuit 100 described above with reference to FIGS. 1A-1C, the plot 200 shown in FIG. 2 illustrates a voltage change at point B in the electrical drive circuit 100 ($V_B$), the input trigger pulse, and the voltage between the anode and the cathode of the optical load 114 ($V_{anode} - V_{cathode}$). As shown in FIG. 2, the inductor 122 discharges stored energy when the switch 110 is open (e.g., while the trigger pulse is at 0V), whereby a pre-charge or voltage boost occurs at point B in the electrical drive circuit 100 while the switch 110 is open, which improves the total power efficiency. As further shown in FIG. 2, the switch 110 may close when the trigger pulse transitions to a high state, at which time $V_B$ suddenly drops to zero or close to zero. This causes the voltage at the cathode ($V_{cathode}$) to drop by the same or a similar amount as $V_B$ due to the capacitor 118 that is AC-coupled between the cathode (point A) and point B, while the voltage at the anode ($V_{anode}$) is maintained at the level supplied by the first source 112. Accordingly, a negative voltage is created at the cathode such that a voltage across the optical load ($V_{anode}-V_{cathode}$) includes a spike in an earlier portion of the duration when the trigger pulse is in the second state. In this way, a compensation pulse with a sharp rise time is provided to the optical load 114, with the compensation pulse complementing a main pulse in time and amplitude such that the main pulse and the compensation pulse combine at the optical load 114 to form a rectangular-shaped pulse with a sharp rise time and a sharp fall time.

Figure 3:
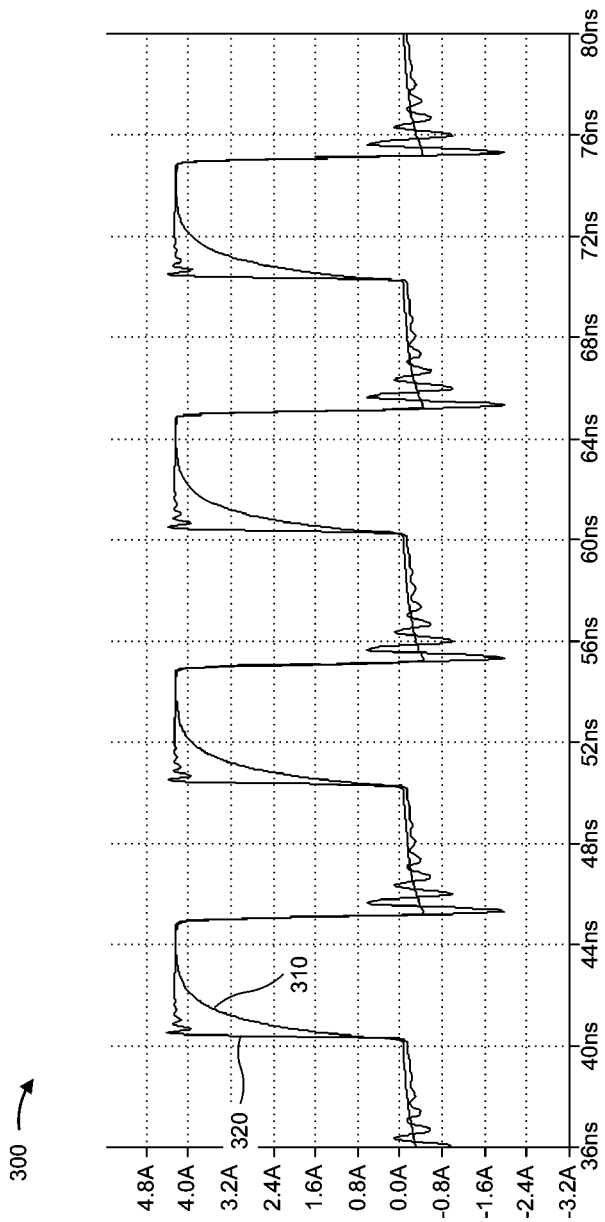

Furthermore, FIG. 3 illustrates an example 300 of a main current pulse 310 without pre-charge compensation on the cathode side, which has a relatively long rise time. Accordingly, as described above, the electrical drive circuit 100 may be configured to generate a complementary current pulse that has a pulse width and an amplitude to complement the main current pulse 310. For example, as described above, the complementary current pulse may have the same amplitude as the main current pulse 310 and a fall time (or pulse width) that is the same as the rise time of the main current pulse 310, where the complementary current pulse is generated by pre-charging the inductor 122 while the switch 110 is closed, and discharging energy stored by the inductor 122 while the switch 110 is open to create a negative voltage on the cathode side of the optical load 114. Accordingly, when the switch 110 is closed and point B in the electrical drive circuit 100 is shorted to the ground 124, the negative voltage at the cathode creates an instantaneous complementary current pulse. The complementary current pulse and the main current pulse 310 are simultaneously provided to the optical load 114, forming a rectangular-shaped current pulse 320 with the pre-charge compensation on the cathode side. As shown in FIG. 3, the pre-charge compensation significantly improves the sharpness of the rise time of the rectangular-shaped current pulse 320, which is defined by the rise time of the complementary current pulse.

Figure 4:
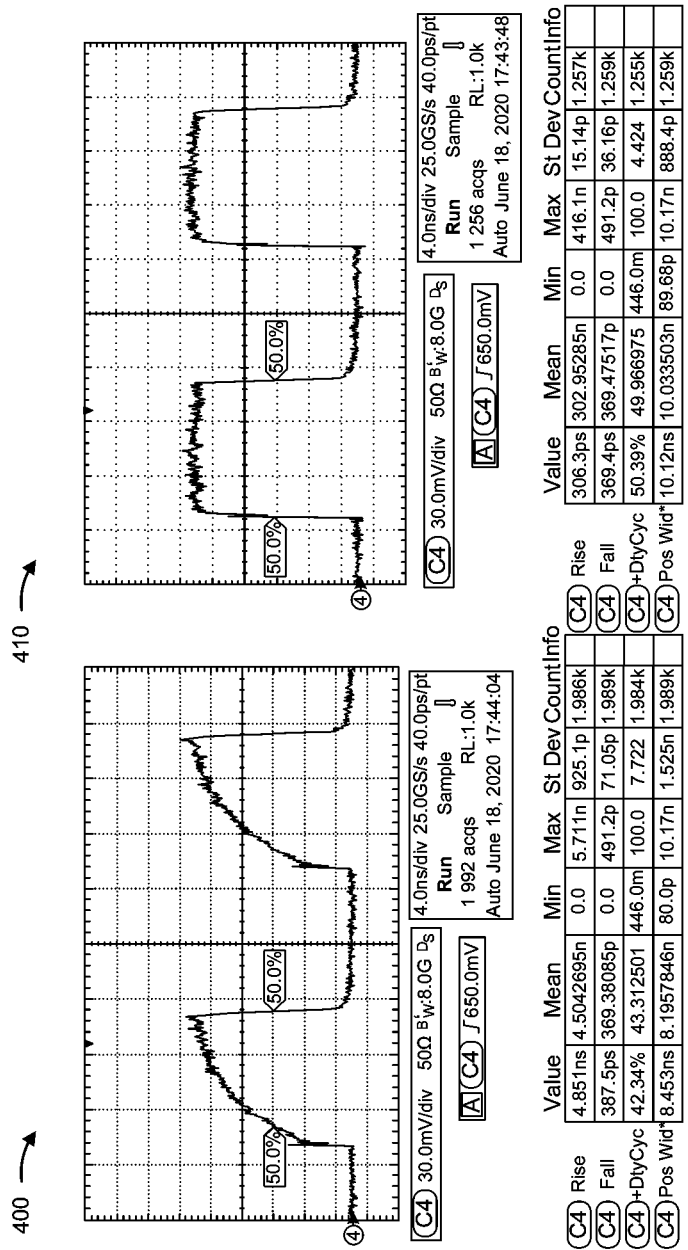

For example, FIG. 4 illustrates an example of a measured optical pulse 400 from an optical load without the pre-charge compensation on the cathode side, and an example of a measured optical pulse 410 with the pre-charge compensation on the cathode side. As shown in FIG. 4, the pre-charge compensation significantly improves the sharpness of the rise time of the optical pulse. For example, without the pre-charge compensation on the cathode side, the measured optical pulse 400 has a mean rise time of approximately 4.5 nanoseconds (ns) with a standard deviation of approximately 925 picoseconds (ps). By combining the optical pulse 400 with a complementary pulse using pre-charge compensation on the cathode side as described herein, the measured optical pulse 410 has a rectangular shape with a much sharper mean rise time of approximately 300 ps with a standard deviation of approximately 15 ps. This may be described as a reduction in rise time of about 4.2 nanoseconds or approximately 93% and a reduction in standard deviation of about 910 picoseconds or approximately 98%.

Figure 5:
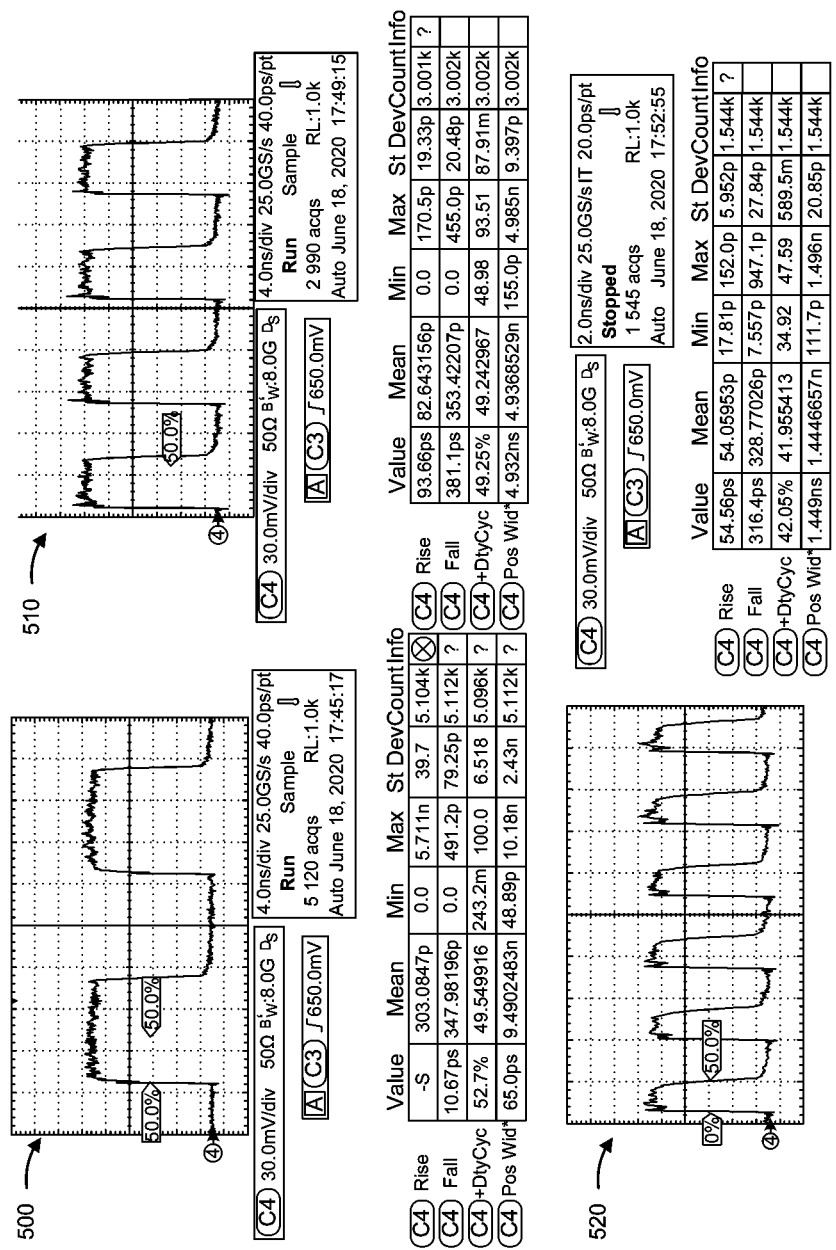

FIG. 5 illustrates one or more examples 500, 510, 520 of a measured optical pulse with the pre-charge compensation on the cathode side at different frequencies. For example, example 500 depicts an optical pulse with the pre-charge compensation on the cathode side at 50 MHz, example 510 depicts an optical pulse with the pre-charge compensation on the cathode side at 100 MHz, and example 520 depicts an optical pulse with the pre-charge compensation on the cathode side at 300 MHz. As shown in FIG. 5, the optical pulse has a rectangular shape, a sharp rise time, and a sharp fall time at different frequencies. For example, FIG. 5 illustrates the optical pulse at different frequencies in a case where the electrical drive circuit is optimized for a range of about 100-150 MHz, whereby no changes may be needed to operate the electrical drive circuit in a range from about 50-300 MHz. To optimize performance for higher frequencies (e.g., above 300 MHz), the inductance value of the inductor and the capacitance value of the capacitor may be reduced. Alternatively, to optimize performance for higher frequencies (e.g., below 50 MHz), the inductance value of the inductor and the capacitance value of the capacitor may be increased.

Figure 6:
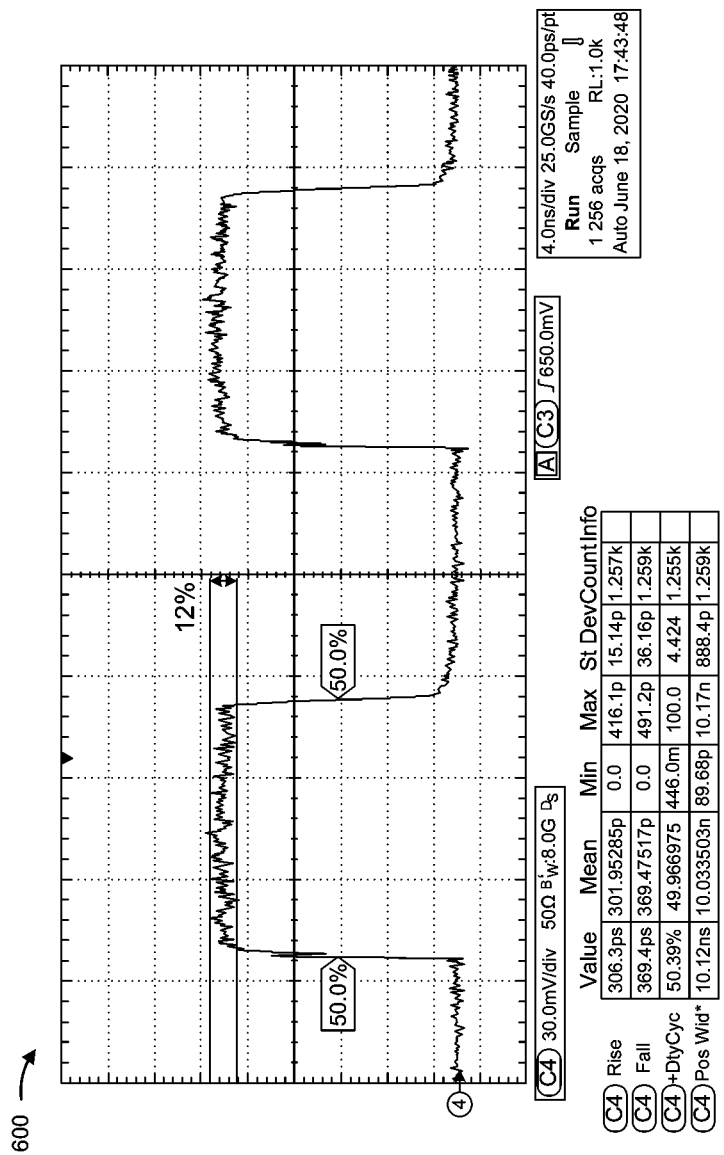

Furthermore, as shown in FIG. 6, and by example plot 600, the rectangular current pulse that is formed by combining the main current and the compensation current may exhibit minimal ripple, which is generally embedded in noise of a corresponding rectangular optical pulse emitted by the optical load when the optical load is connected to the electrical drive circuit. For example, as shown in FIG. 6, the rectangular pulse emitted by the electrical drive circuit 100 may have a ripple amplitude (e.g., a difference between a peak amplitude and a minimum amplitude between the rise time and the fall time) corresponding to about 12% of the peak amplitude. In some implementations, as described above, the reduction in the ripple may be achieved by selecting an inductance value for the inductor 122 that reduces an oscillation frequency of the rectangular-shaped pulse relative to a modulation frequency of the rectangular-shaped pulse.

As indicated above, FIGS. 2-6 are provided as an example. Other examples may differ from what is described with regard to FIGS. 2-6.

Figure 7:
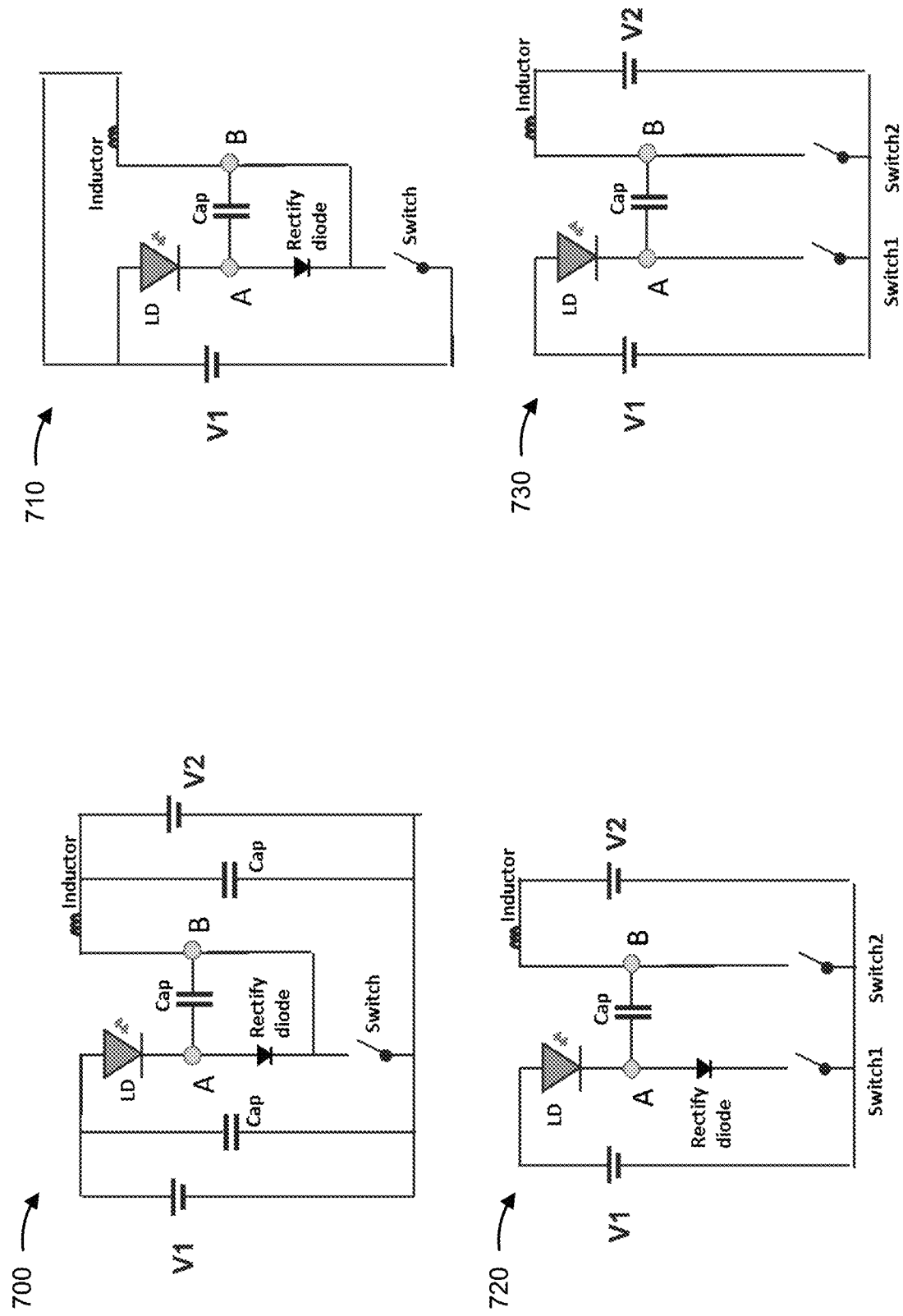
FIG. 7 is a diagram of one or more example electrical drive circuits described herein with a connected optical load.

FIG. 7 is a diagram of one or more example electrical drive circuits 700, 710, 720, 730 described herein having optical loads connected. For example, the electrical drive circuits 700, 710, 720, 730 shown in FIG. 7 may vary one or more aspects of the design of the electrical drive circuit 100 described above with reference to FIGS. 1A-1C.

For example, as shown in FIG. 7, the electrical drive circuit 700 may include a first decoupling capacitor or capacitive element arranged in parallel with the first voltage source (V1) and/or a second decoupling capacitor or capacitive element arranged in parallel with the second voltage source (V2). For example, the decoupling capacitors or capacitive elements may be equivalent series inductance (ESL) capacitors or other capacitors or capacitive elements that are arranged to reduce parasitic inductance in the electrical drive circuit 700. For example, the first decoupling capacitor (or other capacitive element) may be placed in close physical proximity to the anode of the optical load 114 to reduce a parasitic inductance associated with the first circuit path and the second circuit path and provide high current in a shorter time, and the second decoupling capacitor (or other capacitive element) may similarly be placed in close physical proximity to the inductor 122 to reduce a parasitic inductance in the third circuit path.

Additionally, or alternatively, in electrical drive circuit 710, the second voltage source may be eliminated such that the electrical drive circuit 710 includes a single voltage source (V1). For example, the second voltage source may be eliminated from implementations of the electrical drive circuit 100 where the voltage supplied by the first source 112 is equal to the voltage supplied by the second source 120. Additionally, or alternatively, in electrical drive circuit 720, a pair of switches may be used, and the pair of switches may be triggered by the same input trigger signal such that the pair of switches open and close at the same time. Additionally, or alternatively, in electrical drive circuit 730, the rectifier may be eliminated, provided that input signals used to trigger the pair of switches are associated with a timing requirement to ensure that the switches are opened and closed at the same time.

As indicated above, FIG. 7 is provided as an example. Other examples may differ from what is described with regard to FIG. 7.

Figure 8:
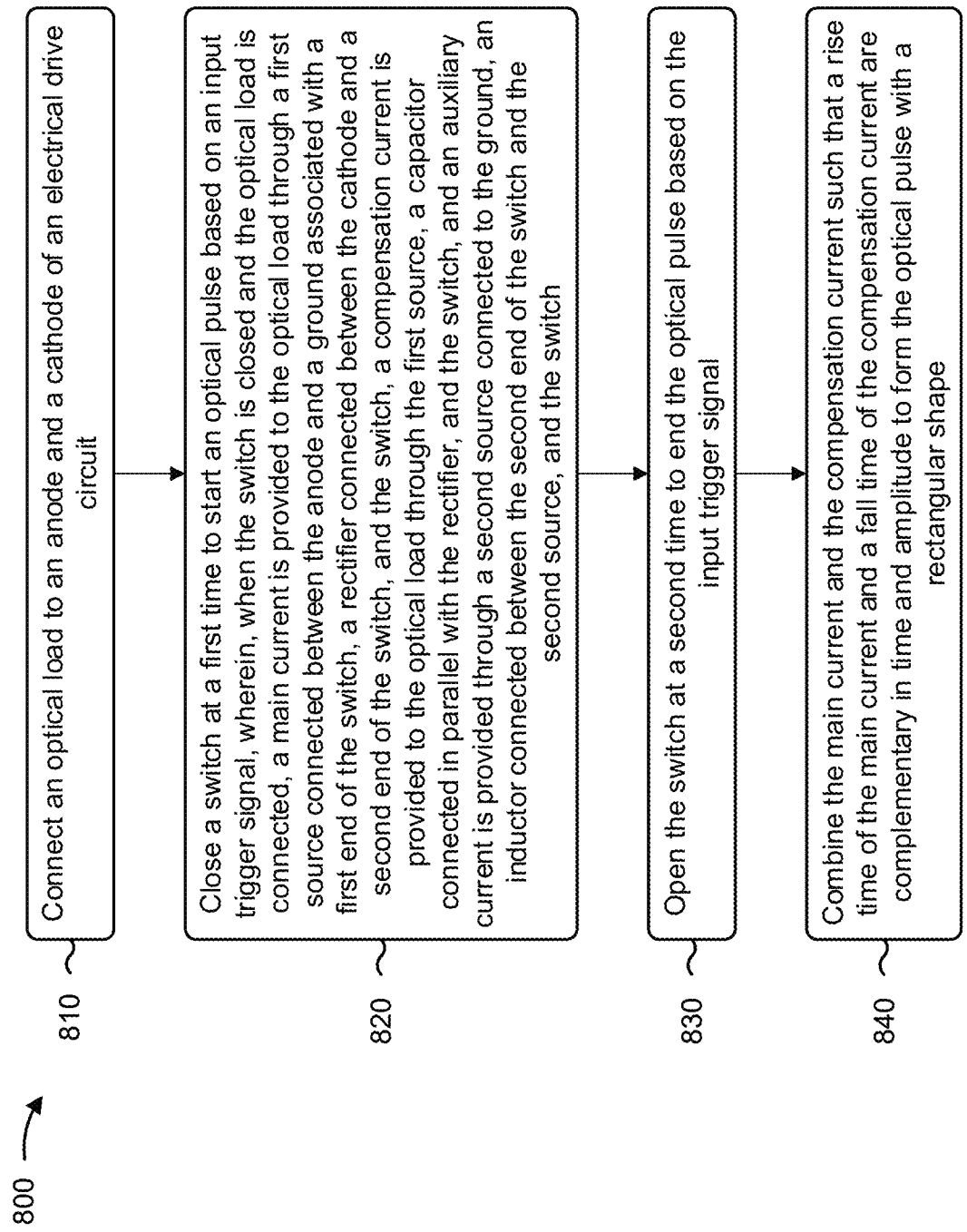
FIG. 8 is a flowchart of an example process relating to driving an optical load to emit rectangular-shaped optical pulses using cathode pre-charge and cathode-pull compensation.

FIG. 8 is a flowchart of an example process 800 relating to driving an optical load to emit rectangular-shaped optical pulses using cathode pre-charge and cathode-pull compensation. In some implementations, one or more process blocks of FIG. 8 may be performed by an electrical drive circuit (e.g., an electrical drive circuit as shown in and/or described above with respect to FIGS. 1A-1C and/or FIG. 7), a time-of-flight-based measurement system (e.g., a direct time-of-flight-based measurement system, an indirect time-of-flight-based measurement system, and/or the like), a 3D sensing system, a LIDAR system, a controller, and/or the like. Additionally, or alternatively, one or more process blocks of FIG. 8 may be performed by one or more components of an electrical drive circuit, an optical device, a time-of-flight-based measurement system, a 3D sensing system, a LIDAR system, a controller, and/or the like.

As shown in FIG. 8, process 800 may include connecting an optical load to an anode and a cathode of an electrical drive circuit (block 810). For example, an optical load may be connected to an anode and a cathode of an electrical drive circuit, as described above. In some implementations, the optical load may be a laser diode, a VCSEL, an edge emitter, a multi-junction laser, a semiconductor laser, a distributed feedback laser, a Fabry Perot laser, or arrays of any of the preceding optical loads, among other examples. Additionally, or alternatively, in some aspects, the optical load and the electrical drive circuit may be assembled on the same substrate and integrated as a single device.

As further shown in FIG. 8, process 800 may include closing a switch at a first time to start an optical pulse based on an input trigger signal. Accordingly, when the switch is closed and the optical load is connected, process 800 may include providing a main current to the optical load through a first source connected between the anode and a ground associated with a first end of the switch, a rectifier connected between the cathode and a second end of the switch, and the switch. In addition, when the switch is closed, process 800 may include providing a compensation current to the optical load through the first source, a capacitor connected in parallel with the rectifier, and the switch. Further, when the switch is closed, process 800 may include providing an auxiliary current through a second source connected to the ground, an inductor connected between the second end of the switch and the second source, and the switch (block 820).

For example, with reference to FIG. 1A and FIG. 1B, a switch 110 may be closed at a first time (e.g., at time t0) to start an optical pulse based on an input trigger signal, as described above. In some implementations, when the switch 110 is closed and the optical load 114 is connected to the electrical drive circuit 100, a main current 130 is provided to the optical load 114 through a first source 112 connected between the anode and a ground 124 associated with a first end of the switch 110, a rectifier 116 connected between the cathode and a second end of the switch 110, and the switch 110. In some implementations, when the switch 110 is closed and the optical load 114 is connected, a compensation current 132 is provided to the optical load 114 through the first source 112, a capacitor 118 connected in parallel with the rectifier 116, and the switch 110. In some implementations, when the switch 110 is closed and the optical load 114 is connected, an auxiliary current 140 is provided through a second source 120 connected to the ground 124, an inductor 122 connected between the second end of the switch 110 and the second source 120, and the switch 110.

As further shown in FIG. 8, process 800 may include opening the switch at a second time to end the optical pulse based on the input trigger signal (block 830). For example, with reference to FIG. 1A and FIG. 1B, the switch 110 may be opened at a second time (e.g., at time ti) to end the optical pulse based on the input trigger signal, as described above.

As further shown in FIG. 8, process 800 may include combining the main current and the compensation current such that a rise time of the main current and a fall time of the compensation current are complementary in time and amplitude to form the optical pulse with a rectangular shape (block 840). For example, with reference to FIG. 1A and FIG. 1B, the main current 130 and the compensation current 134 may be combined at the optical load 114 such that the rise time of the main current 130 and the fall time of the complementary current 134 are complementary in time and amplitude to form the optical pulse with a rectangular shape, as described above. In some implementations, a rise time of the optical pulse is defined by a rise time of the compensation current 134.

Process 800 may include additional implementations, such as any single implementation or any combination of implementations described below and/or in connection with one or more other processes described elsewhere herein.

In a first implementation, the inductor 122 is pre-charged by the second source 120 and discharges the auxiliary current 140 from the second source 120 at a slow rate when the switch 110 is closed, to cause the compensation current 134 to be pulled through the capacitor 118.

In a second implementation, alone or in combination with the first implementation, an inductance value of the inductor 122 causes the inductor 122 to be charged and discharged at a rate that causes the compensation current 134 to be pulled through the capacitor 118 by holding the auxiliary current 140 from the second source 120.

In a third implementation, alone or in combination with one or more of the first and second implementations, the compensation current 134 is an alternating current that flows from the capacitor 118 when the switch 110 is closed to prevent the auxiliary current 140 from flowing through to the optical load 114.

In a fourth implementation, alone or in combination with one or more of the first through third implementations, a voltage supplied by the second source 120 is greater than or equal to a voltage supplied by the first source 112 and/or a difference between the voltage supplied by the first source 112 and a delta that is based on a combined voltage drop on the optical load 114 and the rectifier 116.

In a fifth implementation, alone or in combination with one or more of the first through fourth implementations, an inductance of the inductor 122 is selected to reduce a ripple on the optical pulse having the rectangular shape by reducing an oscillation frequency of the optical pulse relative to a modulation frequency of the optical pulse.

In a sixth implementation, alone or in combination with one or more of the first through fifth implementations, the cathode is associated with a negative voltage that causes the compensation current 134 to be generated when the switch is closed.

In a seventh implementation, alone or in combination with one or more of the first through sixth implementations, a capacitance of the capacitor 118, an inductance of the inductor 122, and a voltage supplied by the second source 120 have respective values that are selected for the optical load 114 such that the rise time of the main current 130 and the fall time of the compensation current 134 are complementary in time and amplitude. For example, as described above, the electrical drive circuit may have a resonance frequency determined by the expression $$f = \frac{1}{2\pi\sqrt{LC}},$$

where L is the inductance value of the inductor 122 and the C is the capacitance value of the capacitor 118. The general relationship between L and C is that the value of LC (the product of L and C) is selected to ensure that the resonance frequency matches the modulation frequency to generate the compensation current 134 efficiently. Additionally, or alternatively, if the modulation frequency differs from the resonance frequency, the correct compensation current 134 may be generated by increasing the voltage supplied by the second source 120.

In an eighth implementation, alone or in combination with one or more of the first through seventh implementations, an amplitude of the compensation current 134 is associated with an instantaneous voltage between the capacitor 118, the inductor 122, the rectifier 116, and the second end of the switch 110 at a time that the switch 110 is closed.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the terms circuit, integrated circuit, chip, chipset, die, semiconductor device, electronic device, and/or the like are intended to be broadly construed as applicable to the various implementations described herein, as these terms can be used interchangeably in the field of electronics. With respect to a circuit, an integrated circuit, and/or the like, power, ground, and various signals may be coupled between and among circuit elements (e.g., resistors, inductors, capacitors, transistors, and/or the like) via physical, electrically conductive connections. Such a point of connection may be referred to as an input, output, input/output (I/O), terminal, line, pin, pad, port, interface, or similar variants and combinations. Although connections between and among circuits can be made by way of electrical conductors, circuits and other circuit elements may additionally, or alternatively, be coupled by way of optical, mechanical, magnetic, electrostatic, electromagnetic, and/or other suitable interfaces.

It will be apparent that systems and/or methods described herein may be implemented in different forms of hardware, software, circuitry, or a combination thereof. The actual specialized control hardware, software code, or circuitry used to implement these systems and/or methods is not limiting of the implementations. Thus, the operation and behavior of the systems and/or methods are described herein without reference to specific software code—it being understood that software and hardware (e.g., integrated circuits) can be designed to implement the systems and/or methods based on the description herein.

Although particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An electrical drive circuit to drive an optical load, comprising:
    an anode and a cathode for connecting an optical load;
    a switch for controlling the electrical drive circuit, the switch defining a ground at a first end of the switch;
    a first source connected between the anode and the ground;
    a rectifier connected between the cathode and a second end of the switch;
    a capacitor connected in parallel with the rectifier;
    a second source connected to the ground; and
    an inductor connected between the second end of the switch and the second source,
        wherein, when the switch is closed and the optical load is connected:
            a first current is provided to the optical load through the first source, the rectifier, and the switch, a second current is provided to the optical load through the first source, the capacitor, and the switch, and a rise time of the first current complements a fall time of the second current.

2. The electrical drive circuit of claim 1, wherein one or more of the first source or the second source include a direct current (DC) voltage source, a regulator, a DC-DC converter, or an alternating current (AC)-DC converter.

3. The electrical drive circuit of claim 1, wherein a voltage supplied by the second source is greater than or equal to one or more of a voltage supplied by the first source, or a difference between the voltage supplied by the first source and a delta that is based on a combined voltage drop on the optical load and the rectifier.

4. The electrical drive circuit of claim 1, wherein, when the switch is closed and the optical load is connected:
the inductor is pre-charged by the second source, and
a third current flows through the second source, the inductor, and the switch.

5. The electrical drive circuit of claim 1, wherein the first current provided to the optical load and the second current provided to the optical load combine to form a pulse having a rectangular wave shape with a rise time of the pulse defined by a rise time of the second current.

6. The electrical drive circuit of claim 5, wherein an inductance of the inductor is selected to reduce a ripple on the pulse having the rectangular wave shape by reducing an oscillation frequency of the pulse relative to a modulation frequency of the pulse.

7. The electrical drive circuit of claim 1, wherein a capacitance of the capacitor, an inductance of the inductor, and a voltage supplied by the second source have respective values that are selected for the optical load such that the rise time of the first current and the fall time of the second current are complementary in time and amplitude.

8. The electrical drive circuit of claim 1, wherein an amplitude of the second current is associated with an instantaneous voltage between the capacitor, the inductor, the rectifier, and the second end of the switch at a time that the switch is closed.

9. An integrated circuit, comprising:
an interface to connect an optical load; and
an electrical drive circuit to drive the optical load, the electrical drive circuit including:
an anode and a cathode to connect the optical load;
a first circuit path that includes a switch, a first voltage source coupled between the anode and a first end of the switch that defines a ground of the electrical drive circuit, and a rectifier coupled between the cathode and a second end of the switch; and
a second circuit path that includes the switch, the first voltage source, and a capacitor coupled in parallel with the rectifier between the cathode and the second end of the switch.

10. The integrated circuit of claim 9, wherein, when the switch is closed and the optical load is connected:
a first current generated in the first circuit path is provided to the optical load through the first voltage source, the rectifier, and the switch,
a second current generated in the second circuit path is provided to the optical load through the first voltage source, the capacitor, and the switch, and
a rise time of the first current and a fall time of the second current are complementary in time and amplitude such that the first current and the second current combine to form a pulse with a rise time defined by a rise time of the second current.

11. The integrated circuit of claim 10, wherein the electrical drive circuit further includes:
a third circuit path that includes the switch, an inductor having a first end coupled to the second end of the switch, and a second voltage source coupled between the first end of the switch and a second end of the inductor,
wherein, when the switch is closed and the optical load is connected:
the inductor is pre-charged by the second voltage source, and
a third current flows through the second voltage source, the inductor, and the switch.

12. The integrated circuit of claim 11, further comprising:
a first decoupling capacitor connected in parallel with the first source,
wherein the first decoupling capacitor is to reduce a parasitic inductance in the first circuit path and the second circuit path, and
a second decoupling capacitor connected in parallel with the second source,
wherein the second decoupling capacitor is to reduce a parasitic inductance in the third circuit path.

13. The integrated circuit of claim 10, wherein, when the switch is closed, the cathode is associated with a negative voltage that causes the second current to be generated in the second current path.

14. The integrated circuit of claim 9, wherein the optical load and the electrical drive circuit are assembled on a same substrate and integrated as a single device.

15. The integrated circuit of claim 9, wherein the optical load includes one or more of a laser diode, a vertical cavity surface emitting laser (VCSEL), an edge emitter, a multi-junction laser, a semiconductor laser, a distributed feedback laser, or a Fabry Perot laser.

16. A method for driving an optical load, comprising:
connecting an optical load to an anode and a cathode of an electrical drive circuit;
closing a switch at a first time to start an optical pulse based on an input trigger signal, wherein, when the switch is closed and the optical load is connected:
a main current is provided to the optical load through a first source connected between the anode and a ground associated with a first end of the switch, a rectifier connected between the cathode and a second end of the switch, and the switch,
a compensation current is provided to the optical load through the first source, a capacitor connected in parallel with the rectifier, and the switch, and
an auxiliary current is provided through a second source connected to the ground, an inductor connected between the second end of the switch and the second source, and the switch;
opening the switch at a second time to end the optical pulse based on the input trigger signal; and
combining the main current and the compensation current such that a rise time of the main current and a fall time of the compensation current are complementary in time and amplitude to form the optical pulse with a rectangular shape.

17. The method of claim 16, wherein the inductor is pre-charged by the second source and discharges the auxiliary current from the second source when the switch is closed to cause the compensation current to be pulled through the capacitor.

18. The method of claim 16, wherein an inductance value of the inductor causes the inductor to be charged and discharged at a rate that causes the compensation current to be pulled through the capacitor by holding the auxiliary current from the second source.

19. The method of claim 16, wherein the compensation current is an alternating current that flows from the capacitor when the switch is closed to prevent the auxiliary current from flowing through to the optical load.

20. The method of claim 16, wherein a voltage supplied by the second source is greater than or equal to one or more of a voltage supplied by the first source, or a difference between the voltage supplied by the first source and a delta that is based on a combined voltage drop on the optical load and the rectifier.

* * * * *